(12) United States Patent
Hedrick

(10) Patent No.: US 6,661,578 B2
(45) Date of Patent: Dec. 9, 2003

(54) IMAGE DISPLAY GENERATOR FOR A HEAD-UP DISPLAY

(75) Inventor: Geoffrey S. M. Hedrick, Malvern, PA (US)

(73) Assignee: Innovative Solutions & Support, Inc., Exton, PA (US)

( * ) Notice: Subject to any disclaimer, the term of this patent is extended or adjusted under 35 U.S.C. 154(b) by 36 days.

(21) Appl. No.: 10/090,961

(22) Filed: Mar. 4, 2002

(65) Prior Publication Data
US 2002/0167485 A1 Nov. 14, 2002

Related U.S. Application Data

(60) Provisional application No. 60/273,305, filed on Mar. 2, 2001, provisional application No. 06/310,509, filed on Aug. 7, 2001, and provisional application No. 60/332,444, filed on Nov. 21, 2001.

(51) Int. Cl.[7] .......................... G02B 27/10; G09G 5/00; F21V 7/04
(52) U.S. Cl. .............. 359/620; 345/4; 345/5; 362/553; 362/555
(58) Field of Search ................. 359/620; 345/4, 345/5; 362/353, 355

(56) References Cited

U.S. PATENT DOCUMENTS

| | | | | |
|---|---|---|---|---|
| 3,981,023 A | * | 9/1976 | King et al. ................ 257/98 |
| 4,185,891 A | * | 1/1980 | Kaestner ..................... 372/9 |
| 5,301,063 A | * | 4/1994 | Tohmon ..................... 359/619 |
| 5,528,057 A | * | 6/1996 | Yanagase et al. ............. 257/96 |
| 5,625,636 A | | 4/1997 | Bryan et al. ................. 257/50 |
| 5,625,637 A | | 4/1997 | Mori et al. .................. 372/96 |
| 5,633,527 A | | 5/1997 | Lear ......................... 257/432 |
| 5,925,898 A | | 7/1999 | Späth ......................... 257/98 |
| 6,091,537 A | * | 7/2000 | Sun et al. ................... 359/248 |
| 6,124,974 A | | 9/2000 | Burger ....................... 359/621 |
| 6,172,723 B1 | | 1/2001 | Inoue et al. ................. 349/95 |
| 2002/0006040 A1 | * | 1/2002 | Kamada et al. ............. 362/237 |
| 2002/0167485 A1 | * | 11/2002 | Hedrick ..................... 345/156 |

FOREIGN PATENT DOCUMENTS

WO  WO 02/071104 A2 * 9/2002

* cited by examiner

Primary Examiner—David N. Spector
(74) Attorney, Agent, or Firm—Cohen, Pontani, Lieberman & Pavane

(57) ABSTRACT

An image display generator for use in a head-up display includes an array of light emitting devices such as LEDs or VCSELs formed on a semiconductor layer deposited on one surface of a glass like, e.g. Sapphire, sheet in which a plurality of lenses are formed on the opposite surface with each lens aligned with a respective one of the LEDs or VCSELs. A layer of transparent insulating material is disposed over the semiconductor layer and is coated with a reflecting material. Light emitted by the LEDs is directly incident onto respective over the lenses and is indirectly reflected onto the lenses by the reflecting material.

26 Claims, 2 Drawing Sheets

IMAGE DISPLAY GENERATOR FOR A HEAD-UP DISPLAY

RELATED APPLICATIONS

This application claims priority from U.S. Provisional Applications Serial No. 60/273,305 (filed on Mar. 2, 2001), Serial No. 60/310,509 (filed on Aug. 7, 2001) and Serial No. 60/332,444 (filed on Nov. 21, 2001).

BACKGROUND OF THE INVENTION

1. Field of the Invention

The present invention is directed to an image display generator or projector for a head-up display, and more particularly to an image display generator comprised of a plurality of light emitting diodes (LEDs) which are individually selectively activatable to emit light for collectively defining or forming an image.

2. Description of the Related Art

In current implementations of head-up displays, such as those used in advanced aircraft, an image projector—which may, for example, comprise a cathode ray tube to which the image to be projected is electronically fed—outputs a visually-perceptible image. The image output from the projector is then directed through a diffractive optics lens to collimate the image, after which the collimated image is reflected, by one or a series of full or partial reflectors, into the pilot's view or sight path for viewing of the projected image in overlaid concurrency with objects located outside of the cockpit windshield or window. The electrical, mechanical and optical components that form such a head-up display understandably require a not insignificant volume of space in the aircraft, and more particularly in and adjacent the cockpit and instrumentation bays—space which is at a tremendous premium in any aircraft. Such CRTs also generate undue amounts of heat that must be dissipated from the source. Although the use of a flat panel liquid crystal display (LCD) as an image projector, in lieu of a cathode ray tube, will somewhat reduce the space required to implement the head-up display apparatus, it remains necessary to direct the image from the LCD through collimating optics located in the light path from the projector prior to its reflection into the sight path of the pilot or flight crew, thus preventing truly significant reduction in the amount of space required for such apparatus. Collimation of the image is required so that the projected image from the head-up display and manipulated into the sight path of the pilot will appear to the pilot to be focussed at infinity, thus permitting the pilot to concurrently see the projected image and objects outside of the aircraft without having to refocus his or her eyes to view one or the other.

SUMMARY OF THE INVENTION

The present invention is directed to an image display generator which solves the aforementioned problems of the prior art by, inter alia, shrinking the image projector to a unitary construction of the thickness of a relatively thick semiconductor wafer, whereby the wafer directly outputs and projects a collimated image that can accordingly be directly reflected into the sight path of the pilot. As a consequence, the inventive display generator or projector—which may, by way of example, in practice have a thickness of about or less than one-quarter inch (¼")—can be mounted closely proximate or adjacent a partially-reflective reflector with which the projected image from the wafer is redirected into the sight path of the pilot.

In accordance with the invention, a unitary display structure is created which incorporates the illuminatable LEDs and a corresponding plurality of lenses for capturing and collimating the light emitted by the actuated LEDs. This is accomplished by providing a sheet of transparent substrate material (such as Sapphire) of substantially uniform thickness and forming or depositing a layer of semiconductor material on one surface of the sheet. LED junctions are formed in the semiconductor layer, and a layer of insulating material is then disposed over the LED-containing semiconductor layer and coated with a layer of reflective material. The opposite or exposed substrate sheet surface is etched or machined or otherwise configured to form in the surface lenses aligned with the LEDs for receiving and collimating light emitted by the LEDs for use in a display.

In a preferred embodiment, the reflective layer regions located proximate the LEDs are contoured to direct light from the LEDs by reflection from the reflective surface, to the lenses, wherein each respective lens, LED and contoured reflective region are in alignment with each other.

In another preferred embodiment, openings are formed in the reflective layer to allow a small portion of the generated light from the LED to be received through the openings by a respective one of a plurality of optical detectors for monitoring the performance of the LEDs.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate and disclose the structures and procedures described herein.

BRIEF DESCRIPTION OF THE DRAWINGS

In the drawings, wherein like reference numerals denote similar elements throughout the several views.

DETAILED DESCRIPTION OF THE PRESENTLY PREFERRED EMBODIMENTS

Figure 1:
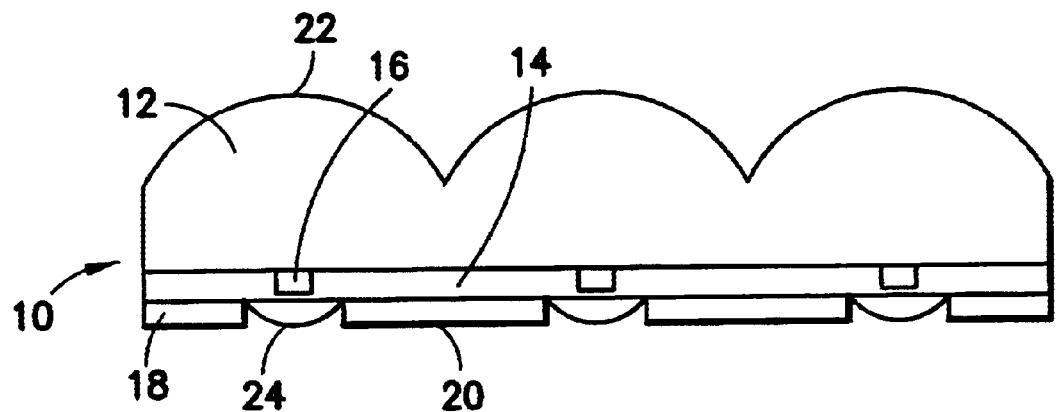
FIG. 1 is a cross-sectional side view of the inventive image display generator in accordance with one embodiment of the present invention.

Manufacture of a display generator 10 in accordance with the invention, as depicted in FIG. 1, begins with a sheet of transparent, preferably clear, glass-like material having a relatively high refractive index and a substantially constant and known thickness. A suitable and currently preferred material is Sapphire, and Sapphire sheets are commercially available. A thin layer of semiconductor material 14 such as Gallium Arsenide (GaAs) is then grown or deposited in a known manner on one surface of the Sapphire sheet 12. LED (light emitting diode) junctions 16, and (in preferred forms of the invention) associated or support circuitry, and interconnects therefor, are diffused into the Gallium Arsenide 14 to form the actuatable LED light emitters. An insulating passivation layer such as of Silicon Dioxide ($SiO_2$) is then layered or deposited on the Gallium Arsenide layer which contains the LEDs and interconnects and optional support circuitry.

A thin layer of reflective material 20, such as aluminum, is then sputtered atop the Silicon Dioxide passivation layer to form a reflector so that light emitted by the activated LEDs through the Silicon Dioxide layer 18 is reflected by the aluminum layer 20 and returned back toward the Sapphire sheet 12. Lenses 22 are then formed, such as by known etching or micro-machining techniques, in the other or opposite or exposed surface of the Sapphire sheet in a one-to-one numerical and positional correspondence with the LEDs. In this manner light emitted by the LEDs is directed through the corresponding lenses and thereby output from the inventive image display generator as a collimated beam of light from each corresponding activated LED.

Specifically, light is emitted by each LED 16 both (i) toward the corresponding micro-machined lens 22 in the immediately adjacent Sapphire sheet, and (ii) in the opposite direction—i.e. through the Silicon Dioxide layer 18 and onto the aluminum layer 20 which reflects the incident light back through the Silicon Dioxide layer toward the corresponding micro machined lens in the Sapphire sheet. In this manner, a very high percentage of the light emitted by each LED is captured and directed through the corresponding lens to form a collimated beam of light from that activated LED, thereby providing a unitary image display generator of unusually high efficiency.

The inventive image display generator also provides several additional advantages by virtue of its novel structure and arrangement. For one, the construction of the generator 10 enables the realization and inclusion of exceptionally high precision lenses in close proximity to the light generating LEDs. Moreover, the currently preferred substrate material Sapphire exhibits an advantageously high index of refraction, and is also extremely durable. Sapphire is also a highly efficient conductor of heat, and is thereby able to efficiently carry away from the LEDs much of the excess heat that is generated when the LEDs are activated.

The $SiO_2$ rear passivation layer may also be etched or micro-machined to create contoured or shaped lenses 24, which, when coated with the aluminum 20, from reflectors to further improve the optical efficiency of the resulting display, as shown in FIG. 1. The curvature of each reflector lens or surface 24 should be matched to that of the corresponding Sapphire lens aligned with the same LED to assure a collimated beam. The LED emitting junction should be located at the focal point of the Sapphire lens with the reflector lens shaped and positioned so that its focal point is at or on the LED junction. When the LED emitting junction is located at the focal point of the lens, the light from the LED is collimated (i.e. focused near infinity).

Figure 2:
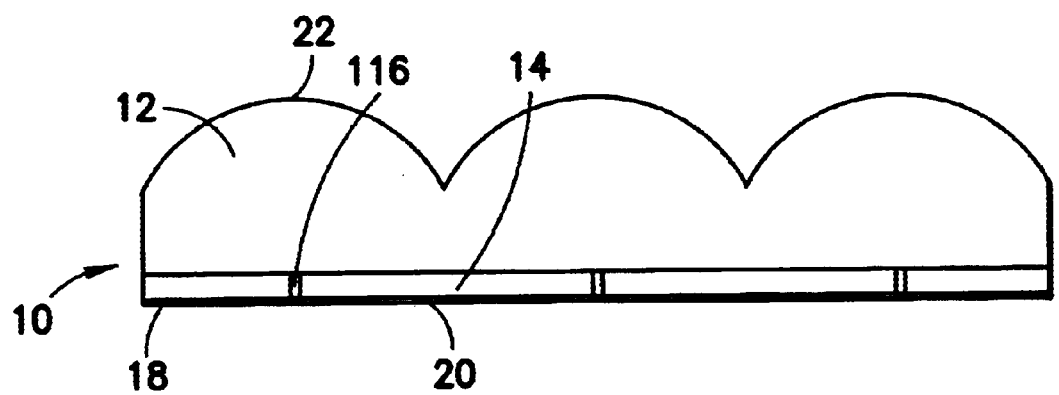
FIG. 2 is a cross-sectional side view of another embodiment of the display generator of FIG. 1.

FIG. 2 depicts an enhanced version of the above-described implementation—which may be implemented, as a matter of design choice, with or without the provision of reflectors micro-machined into the $SiO_2$ layer 18—that utilizes vertical cavity surface emitter laser diodes (VCSELs). Such VCSELs are typically fabricated, as is known in the art, using ion implantation so that the junction is oriented substantially perpendicular to the light-emitting face or surface of the display generator and the emission of light from each actuated diode is likewise perpendicular to the plane of the surface. The passivation layer 18 of $SiO_2$ or similar insulating material is coated with a layer 20 of reflective or reflecting material such as aluminum with the distance from the diode junction to the surface of the aluminum reflective material being adjusted to initiate lasing, so that the diode emission is reflected back from the reflective material into the diode junction in-phase. The light emission cone of this vertical structure is nearly collimated and therefore requires very little correction from the Sapphire lens. The diode structure can be electrically driven at low levels below the lasing threshold or at higher levels at which the spectral distribution is very narrow. A combiner (not shown) can then be tuned to this very narrow spectrum of light. In currently preferred implementations, the wavelength of emission is adjusted to a green color of approximately 541 nanometers. The enhanced embodiment of FIG. 2 thus offers an even more precisely collimated emission and the potential of unusually high brightness as compared to that produced by the embodiment of FIG. 1.

In a further enhanced embodiment based on either of the arrangements of FIG. 1 or 2, the GaAs layer 14 may be doped or alloyed to provide the desired or correct color of light with still higher efficiency, as for example by using materials such as GaAlAs to form the LEDs 16 or VCSEL diodes 116.

Figure 3:
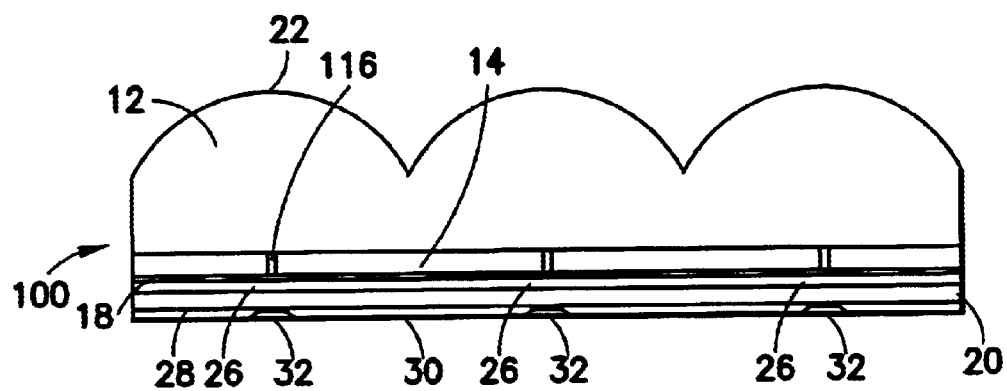
FIG. 3 is a cross-sectional side view of still another embodiment of a display generator in accordance with the present invention.

A yet further modification of a display generator in accordance with the invention, is shown in FIG. 3. The generator of FIG. 3 is provided with a second or additional array of photodiodes 32 for use in monitoring the light emissions from the primary array of LEDs 16 or VCSEL diodes 116. Although this further modification may be applied to any of the forms of the inventive image generator hereinabove described by way of now contemplated example, the currently preferred implementations utilize a primary array of vertically-arranged light emitting diodes and, most preferably, the general arrangement of FIG. 2 in which the primary array of light-emitting diodes is implemented using VCSELs 116.

Specifically, after deposit of the aluminum reflective layer 20 on or over the $SiO_2$ passivation layer 18, the reflective layer is etched to provide a multiplicity of openings or holes or throughbores 26 defined in and through the reflective layer 20; the holes 26 are aligned in one-to-one correspondence with the VCSELs 116 of the primary array. In this manner a very small amount of the light emitted by each activated VCSEL diode is permitted to pass through the corresponding hole in the aluminum reflective layer 20 (with the remainder emitted toward the layer 20 being reflected by the layer 20 back to the VCSEL diode 116 as described above). A second passivation layer of $SiO_2$ 28 is deposited or disposed atop the reflective material 20 and a layer 30 of silicon is deposited on the $SiO_2$ layer to thereby insulate the silicon layer 30 from the aluminum reflective layer 20. An array of photodiodes 32 is then formed in the layer of silicon 30, with each photodiode being located in one-to-one alignment with a corresponding hole 26 (in the aluminum reflective layer 20) for receipt by the photodiode of the VCSEL diode light that passes through the aligned hole when the laser diode is activated. In this manner each photodiode detects or "reads" the small amount of light that passes through the corresponding hole in the reflective layer when the corresponding VCSEL diode is activated, and thereby monitors the operation of that corresponding VCSEL diode.

In use, the photodiodes 32 may be scanned synchronously with the VCSELs 116. As currently contemplated, the VCSEL diodes are activated or excited by applying a drive voltage sequentially to each column of the array and grounding the appropriate VCSEL selecting row through a current limiter to thereby control the flow of current through each VCSEL, as is known in the art. The photodiodes 32 are synchronously "read" in a similar fashion by monitoring or detecting the current flow in the array rows; the flow of current through each photodiode 32 is a function of the light that is incident on the photodiode from the corresponding VCSEL diode 116 through the reflective layer hole that is located between them. This arrangement accordingly provides the advantageous capability of readily and automatically monitoring the image that is being (or that is intended or expected to be) created by the inventive display generator through selective actuation of the plurality of VCSEL diodes or LEDs that form the primary array.

It is also contemplated that, instead of etching or otherwise defining small holes 26 in and through the reflective material 20 for carrying a small amount of emitted light from the VCSEL diodes to the corresponding photodiodes, the reflective layer may be selectively etched or the like to suitably thin the layer in the region between each VCSEL 116 and photodiode 32 to an extent sufficient to define a partially reflective area or region between each VCSEL diode and its corresponding photodiode. By suitably thinning the reflective layer 20 in each such region instead of defining an unobstructed throughbore or opening 26, a first (and preferably substantially greater) proportion of the light emitted toward the reflective layer from the corresponding photodiode will be reflected and a second (and preferably much smaller) proportion of the VCSEL diode emitted light will pass through the thinned reflective layer region for receipt and detection by the corresponding photodiode.

Any of the embodiments or implementations of the inventive display generator may also be further modified to facilitate selective or predetermined reorientation of the projected image, e.g. projection of the image onto or into alignment with oblique (i.e. angled) and/or curved (i.e. non-flat) surfaces, such as an aircraft or vehicle windshield. This may, for example, be accomplished by adjusting some or all of the lenses 20 that are defined in the Sapphire (or other substrate material) layer 12 to selectively vary the direction or angle of emission of the diode-generated light from the light-emitting face or surface of the display generator. One way to accomplish or facilitate this adjustment is that, prior to the forming of each lens on the Sapphire layer, the Sapphire surface at that location may be angled or inclined in a predetermined direction and to a predetermined degree to form a prism that selectively steers the emitted light without changing the focal length of the resulting image. The lens is then formed in the Sapphire material at this surface-angled or inclined location, thus providing both redirection or steering (via the prism) and focusing or collimation (via the lens) of the emitted light that is operatively output by the inventive display generator. Where further focusing or collimation of the laser diode emission is not required, a steering or redirecting or otherwise emission modifying prism or angled surface or the like can be provided in the Sapphire material without then additionally forming a lens at that surface location of the Sapphire material.

The present invention thus advantageous provides an image display generator or projector of high efficiency and unusually compact form. The display generator is formed in its entirety in a unitary fashion on a sheet-like substrate that minimizes, to an extent not heretofore attainable, the spatial volume required to provide its image generating and projection capabilities and facilitates selective placement of the generator in unusually confined environments—such as the cockpit or instrumentation bay of an aircraft—for interaction with other image directing or redirecting components to form, for example, a head-up display in an aircraft pilot's normal field of view. The preferred forms of construction of the inventive unitary display generator additionally provide highly efficient projection of the illumination generated by the plurality of light generating LEDs or VCSELs and the like to yield projected images of unusual brightness, focus and clarity while avoiding detrimental accumulation in the display structure of heat from the operating diode structures.

Although the inventive display generator finds particular utility in the implementation of a head-up display for high-performance or commercial or military aircraft, it may also be employed as a part of a head-up display in spacecraft or automobiles or any other vehicles or devices or articles or environments. Indeed, the inventive generator may be employed in any situation or environment in which it is desired to display a projected image, for which purpose it may be desirable or determined to vary the orientation and/or curvatures, etc. of the lenses formed on the projection surface of the Saphire or other substrate material to adjust the focal length of the lenses so that the projected image is focused at a predetermined distance (other than infinity) from the generator.

It is also contemplated that, in implementing the inventive image display generator using any one or combination of the embodiments herein described and disclosed by way of currently preferred example, additional layers and/or structural and operating features may be added to the disclosed combination(s) of layers carried on the base (e.g. Saphire) substrate as a general matter of design choice and within the scope of the invention. The invention is also fully intended to include the use of different but otherwise generally equivalent, in constituent(s) and/or function and/or characteristics, materials than those herein expressly mentioned or described by way of currently preferred illustration.

The illustrative implementations of the invention herein described generally contemplate the generation and projection of a monotone or single color image of a particular, predetermined wavelength primarily determined by the emission spectra of the LEDs or VCSELS. These arrangements may be readily modified to provide multi-color images by placing, at each position or location at which a single LED or VCSEL is indicated in the above-described embodiments, a plurality of LEDs or VCSELS each operable to generate light at a respectively different wavelength, as for example red, green and blue for a full-color or multiple color display projector. In such a modification the multiple LEDs or VCSELS for each position should be placed in close and tightly compacted proximity so that the light generated by the multiple LEDs or VCSELs at that position is projected outward through and collimated and/or directed by the same lens that is aligned with and defined for that position in the projection surface of the base substrate material. Alternatively, an individual lens may be defined in the based substrate surface for each of the multiple LEDs or VCSELS at each position, with the multiple lenses for each position tightly grouped together for outward projection and collimation of the multiple-color light generated at that position. Thus, for LEDs or VCSELS operable to respectively generate red, green and blue light for a particular position, the lenses may be formed as a triad aligned with the similarly disposed LEDs or VCSELs of that position.

Thus, while there have shown and described and pointed out fundamental novel features of the invention as applied to preferred embodiments thereof, it will be understood that various omissions and substitutions and changes in the form and details of the methods described and devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An image display generator operable for use in generating an image, comprising:
    a sheet of transparent substrate material having a plurality of lenses formed in a first image projecting surface of that sheet;
    a layer of semiconductor material disposed on a second surface of the sheet;
    a plurality of selectively operable light generating devices formed in said semiconductor material layer, each said light generating device being aligned with a respective one of said lenses for directing light operatively emitted by said each light operating device in a first direction through said substrate toward the respective lens and in a second direction away from said substrate;
    a layer of transparent insulating material disposed over said semiconductor material; and
    a layer of reflective material disposed over said insulating material for receiving, from each light generating device and reflecting the second direction light back to the respective aligned lens so that each said respective lens collimates the first and second direction light produced by the respective each light generating device for projection from the display generator.

2. The image display generator of claim 1, wherein said sheet of transparent substrate material comprises a material having a high index of refraction and which is an efficient conductor of heat.

3. The image display generator of claim 1, wherein said sheet of transparent substrate material comprises Sapphire.

4. The image display generator of claim 1, wherein said plurality of lenses is configured in an array and is formed by micro-machining.

5. The image display generator of claim 1, wherein said layer of semiconductor material comprises one of GaAs and GaAlAs.

6. The image display generator of claim 1, wherein said plurality of light generating devices comprises an array of LED s.

7. The image display generator of claim 1, wherein said plurality of light generating devices comprises an array of VCLEs.

8. The image display generator of claim 1, wherein said layer of transparent insulating material comprises $SiO_2$.

9. The image display generator of claim 1, wherein said layer of reflective material comprises aluminum.

10. The image display generator of claim 1, wherein said layer of insulating material comprises a plurality of contoured regions formed on a surface of the transparent insulating material over which said reflective layer is disposed to form a plurality of contoured reflectors in one-to-one alignment with said light generating devices and said lenses for enhancing reflection of said second direction light from each said light generating device to the respective lens for projection from the image display generator.

11. The image display generator of claim 10, wherein each said lens has a focal point and wherein said plurality of light generating devices comprises an array of one of LEDs and VCSELs each having an emitting junction located at the respective focal point of the respective lens and at a respective focal point of a respective aligned contoured reflector.

12. The image display generator of claim 1, wherein said reflective layer defines a plurality of light transmission regions positioned in one-to-one alignment with said plurality of light generating devices for passing second direction light from each light generating light nonreflectively through the reflective layer at the aligned light transmission region, said image display, generator further comprising a second layer of transparent insulating material disposed on said reflective layer, and a second layer of semiconductor material disposed on said second layer of insulating material, said second semiconductor layer containing a plurality of optical detectors located in one-to-one alignment with said light transmission regions for detecting a portion of said second direction light that passes through said reflective layer at the respective light transmission regions to maintain operation of the respective light generating devices.

13. The image display generator of claim 12, wherein said light transmission regions of said reflective layer comprise openings in and through said reflective layer.

14. The image display generator of claim 12, wherein said light transmissive regions of said reflection layer comprise semi-transparent thinned regions of the reflective layer for passing through each light transmissive region only a portion of the second direction light incident on the each light transmissive region from the respective aligned light generating device.

15. The image display generator of claim 1, wherein each said light generating device comprises one of an LED and a VCSEL.

16. The image display generator of claim 1, wherein each said light generating device comprises a plurality of individually operable ones of one of an LED and a VCSEL.

17. A method of forming an image display generator for projecting an image formed of collimated beams of light, comprising the steps of:
    forming a plurality of lenses in a first surface of a sheet of transparent substrate material having first and second surfaces;
    disposing a layer of semiconductor material on the second surface of the substrate,
    defining in the semiconductor material disposed on the second surface of the substrate a plurality of light generating devices each aligned with a respective one of the lenses for directing light emitted from the each light generating device in a first direction through the substrate toward the respective lens and in a second direction away from the substrate;
    disposing a layer of transparent insulating material over the semiconductor layer; and
    disposing a layer of reflective material over the insulating material layer for receiving and reflecting the second direction light emitted from each light generating device back from the reflector material layer to the respective lens so that each respective lens receives and collimates and projects outwardly from the display generator the first and second direction light produced by the respective aligned light generating device.

18. The method of claim 17, wherein said step of forming the lenses comprises micro-machining the lenses in the first surface of the substrate material.

19. The method of claim 17, wherein the sheet of transparent substrate material comprises Sapphire.

20. The method of claim 17, further comprising the step of forming a plurality of contoured regions in a surface of the insulating layer over which the reflective layer is disposed to form a plurality of contoured reflectors in one-to-one alignment with the light generating devices and the respective lenses.

21. The method of claim 20, wherein each said lens has a focal point and wherein said light generating device comprises an emitting junction located at the focal point of the respective lens and a focal point of the respective contoured reflector.

22. The method of claim 17, wherein said step of disposing a reflective layer further comprises the step of forming a plurality of light transmission regions in the reflective layer positioned in one-to-one alignment with the plural light generating devices, and said method further comprising the steps of disposing a second layer of transparent insulating material on said reflective layer, disposing a second layer of semiconductor material on said second layer of insulating material, and defining in the second semiconductor layer a plurality of optical detectors located in one-to-one alignment with the light transmission regions for detecting a portion of the second direction light that passes through the light transmission regions.

23. The method of claim 22, wherein step of forming the light transmission regions of said reflective layer comprises defining an opening in and through the reflective layer to form each of the light transmission regions.

24. The method of claim 22, wherein step of forming the light transmission regions of said reflective layer comprises thinning the reflective layer at each light transmissive region for passing through each light transmissive region only a portion of the second direction light incident on the each light transmissive region from the respective light generating device.

25. The method of claim 17, wherein said step of forming the plurality of lenses in the first surface of the substrate material is carried out after said step of defining the plurality of light generating devices in the semiconductor material.

26. The method of claim 17, wherein said step of forming the plurality of lenses in the first surface of the substrate material is carried out before said step of defining the plurality of light generating devices in the semiconductor material.

* * * * *